United States Patent

Miedema

[11] 4,088,948
[45] May 9, 1978

[54] SINGLE TONE TECHNIQUE FOR MEASURING IM DISTORTION

[75] Inventor: Hotze Miedema, Boxford, Mass.

[73] Assignee: Bell Telephone Laboratories, Incorporated, Murray Hill, N.J.

[21] Appl. No.: 753,706

[22] Filed: Dec. 23, 1976

[51] Int. Cl.² ............................................. G01R 27/00
[52] U.S. Cl. ......................... 324/57 R; 179/175.31 R; 325/67
[58] Field of Search ................ 324/57 R, 57 N, 57 H, 324/57 SS; 179/175.31; 325/67, 133

[56] References Cited

U.S. PATENT DOCUMENTS

| 3,875,512 | 4/1975 | Baranyi et al. | 325/67 |
| 3,913,011 | 10/1975 | Hughes et al. | 324/57 R |
| 4,028,622 | 6/1977 | Evans et al. | 324/57 N |

*Primary Examiner*—Stanley T. Krawczewicz
*Attorney, Agent, or Firm*—Bryan W. Sheffield; Sylvan Sherman

[57] ABSTRACT

Third order IM distortion in a microwave repeater is measured in situ by applying a small amount of low frequency amplitude-modulation to the payload signal while at the same time adding a test-tone of fixed frequency and amplitude. At the repeater's output, a pair of synchronous detectors, driven in phase quadrature by the test-tone generator, measure the modulation depth of the test-tone. This modulation depth is now a measure of the degree of distortion in the repeater.

7 Claims, 1 Drawing Figure

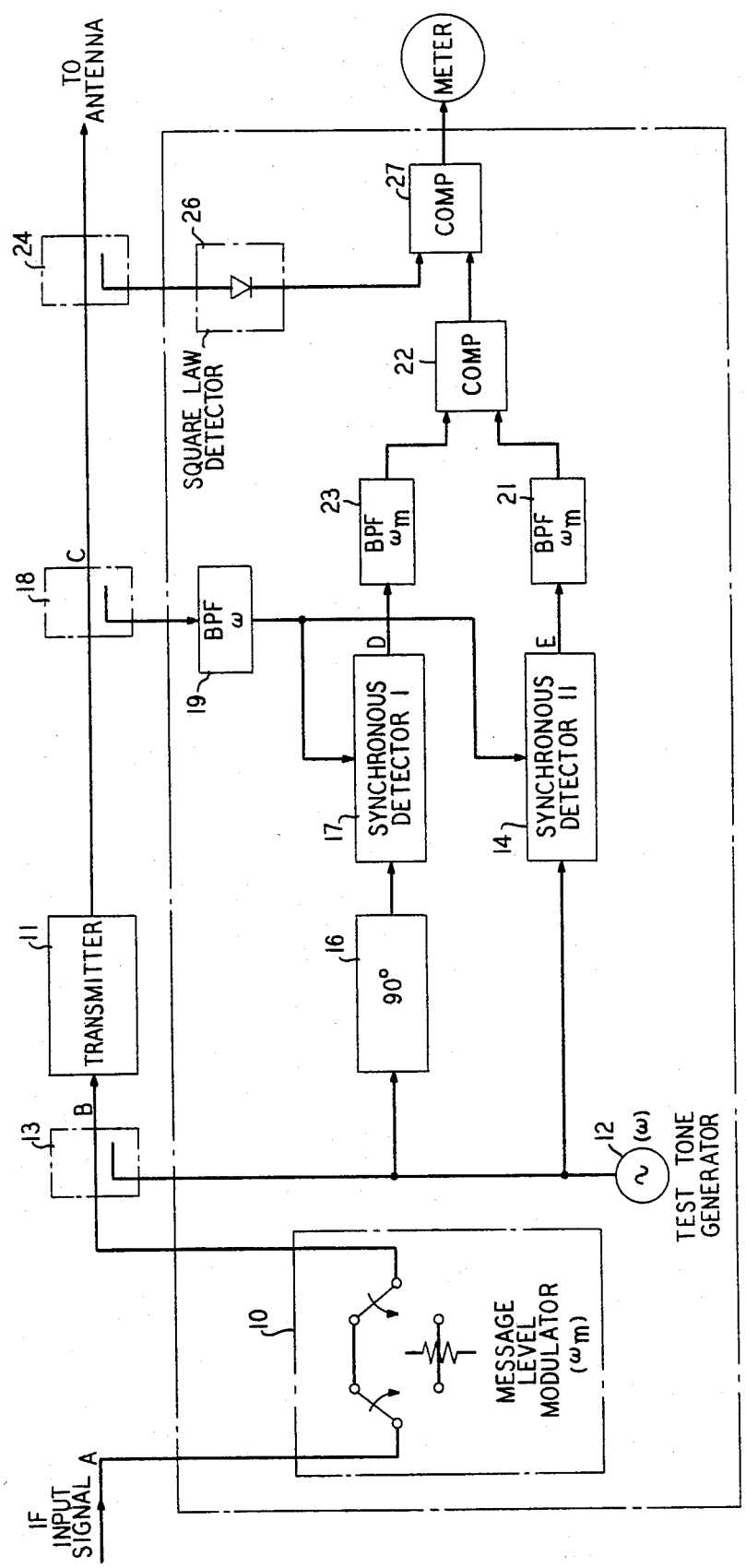

SINGLE TONE TECHNIQUE FOR MEASURING IM DISTORTION

BACKGROUND OF THE INVENTION a. Field of the Invention

Broadly speaking, this invention relates to the measurement of distortion. More particularly, in a preferred embodiment, this invention relates to methods and apparatus for measuring the intermodulation distortion generated by microwave repeaters, and the like.

b. Discussion of the Prior Art

Multi-channel, microwave transmission systems employing suppressed-carrier, single-sideband, amplitude-modulation have been proposed as a replacement for existing frequency-modulation systems. Due to the nature of amplitude-modulation, such systems will be more sensitive to non-linearities in the microwave repeaters than are the FM systems, for example. Of particular concern are third order IM distortion products which tend to fall within the passband of the transmission system and, hence, are potentially troublesome. Accordingly, whenever a single-sideband microwave route is placed in service it will be necessary to implement a testing procedure providing for routine field measurements of the linearity of the microwave repeaters along the route to insure that distortion of the amplitude-modulated signal is held to a minimum.

One way to perform this routine maintenance procedure would be to selectively take each repeater along the route out of service, and then subject the repeater to any of several, known IM testing procedures. Alternatively, the novel, swept-frequency testing procedure described in my co-pending patent application, H. Miedema U.S. Pat. No. 4,048,559 issued Sept. 13, 1977, may be employed.

All such testing procedures require that the repeater under test be taken out of service, which complicates scheduling of the test procedure. Also, the generation and insertion of multiple test-tones, and the selection of the desired intermodulation products, requires complicated and expensive hardware. Further, the high-level test-tones employed create a potential interference problem in adjacent systems.

Clearly, what is needed is a testing procedure which can be performed on a repeater in situ, and preferably while the repeater is in service, under actual working conditions. This testing procedure will advantageously be less complicated, and the testing equipment less expensive, than that required heretofore.

SUMMARY OF THE INVENTION

Fortunately, these and other problems have been solved by the instant invention. Briefly, the invention comprises a testing procedure which employs only one test-tone. This considerably reduces the amount of hardware required and, in addition, reduces the potential for interference since the single test frequency can be located near the center of the passband where it does not interfere with the message load.

One skilled in the art will perceive that the use of a single-frequency test-tone makes it necessary to find some means for separating the non-linear part of the tone output from the repeater from the linear part. The difficulty, of course, is that both parts have the same frequency. Fortunately, this separation is readily accomplished in the instant invention by amplitude-modulating the incoming message signal, but not the single-frequency test-tone.

Another important aspect of the invention is that the measurement sensitivity is increased over the known systems by using two synchronous detectors, driven in phase quadrature, and by the selection of the largest of the two detector outputs. This novel approach eliminates the uncertainty introduced by the unknown phase of the reference signal which drives the synchronous detectors, without at the same time causing the serious deterioration in the signal-to-noise ratio which would have resulted had the unknown phase of the reference signal been eliminated by using the conventional technique of taking the sum of the squares of the outputs from the synchronous detectors.

The invention and its mode of operation will be more fully understood from the following detailed description, when taken with the accompanying drawing which depicts an illustrative circuit arrangement for practicing the invention.

DETAILED DESCRIPTION OF THE INVENTION

When a single-frequency test-tone is added to the payload spectrum transmitted by a single-sideband transmission system, for example the 6 GHz system known in the industry as AR-6A, intermodulation between the test-tone and the rest of the spectrum causes a non-linear phase shift of the test-tone due to AM/PM conversions as well as an amplitude reduction due to gain compression. It can be shown that for a third order non-linearity in the transmission system, both the non-linear phase shift and the amplitude reduction are proportional to the total message power and to the degree of third order non-linearity present in the system. I have discovered that these combined effects can be used to measure transmission non-linearity.

Measuring non-linearity in this manner has the advantage that no second test-tone is required; i.e., only one frequency slot is required rather than three. Advantageously, the test-tone can be located near the center of the passband to minimize interference into adjacent FM systems. Since the measurement depends only on the total signal power and not on the shape of the signal spectrum, it is possible to use a signal that will minimize interference, such as the message load itself, for in-service testing or, if that is not convenient, a noise load for out-of-service testing. The sensitivity obtained with a single test-tone of +20 dBm, assuming a total signal power of +27 dBm and a message level modulation of 0.5 dB peak-to-peak, is equivalent to that obtained with two tones of +19 dBm each in a two-tone test.

The measurement technique disclosed herein requires the ability to distinguish between linear and non-linear components of a single-frequency test-tone. To separate these components, the level of the incoming signal is modulated periodically by a small amount (e.g., 0.5 dB) during the measurement. The circuit arrangement is such that this modulation affects only the non-linear part of the test-tone output, not the linear part, and thus permits a separation of the two. The amplitude of the non-linear part can now be retrieved and is a direct measure of the non-linearity of the system. It can be shown that the sidebands created by the small degree of amplitude-modulation applied to the input signal during the testing process, do not contribute measurably to the background noise level of the payload.

As shown in the drawing, the incoming signal, illustratively an FDM multiplex signal which has priorly been translated up to a 70 MHz IF frequency, is applied to a modulator 10 having a modulation frequency $\omega_m$. The output of modulator 10 is applied to the input of a microwave transmitter 11 that typically includes a travelling wave tube, or the like. The output of transmitter 11 is connected to a microwave antenna (not shown) in the normal manner.

A generator 12 generates a single-frequency test-tone of frequency $\omega$, which test-tone is added to the FDM signal applied to the input of transmitter 11, via a coupler 13. The output of generator 12 is also applied to a first synchronous detector 14 and, via a 90° phase shifter 16, to a second synchronous detector 17, as shown. A portion of the output from transmitter 11 is tapped-off by a coupler 18 and applied, via a bandpass filter 19, to the input of synchronous detectors 14 and 17. The output of detector 14 is applied, via a bandpass filter 21, to a comparator 22. In like fashion, the output of detector 17 is applied, via a second bandpass filter 23, to another input of comparator 22. A third coupler 24 taps off a further portion of the output of transmitter 11 and applies it to a square-law detector 26. The output of detector 26 and the output of comparator 22 form the inputs to a second comparator 27. As will be explained below, coupler 24, detector 26 and comparator 27 may be omitted in some circumstances. It will be appreciated that transmitter 11 may form part of an intermediate microwave repeater along the transmission route or it may comprise one terminal of the microwave system.

In operation, we will assume that the incoming fdm signal at point A comprises a multiple frequency sepctrum of the form:

$$\sum_n A_n \sin \omega_n t,$$

which signal represents either a message payload or a noise load.

During the linearity measurement, the level of the incoming signal will be modulated by modulator 10, causing the level at point B to vary periodically between $$\sum_n A_n \sin \omega_n t \text{ and } k_1 \sum_n A_n \sin \omega_n t.$$

Using a suitable slot in the frequency spectrum, generator 12 inserts a test-tone:

$$a \sin \omega t$$

into the input signal to transmitter 11 during the linearity measurement.

The input to the transmitter at point B will then be given by the equation:

$$V_i = a \sin \omega t + k \sum_n A_n \sin \omega_n t \quad {}^{k=1}_{k=k_1} k_1 < 1. \quad (1)$$

Transmitter 11 amplifies this signal and introduces distortion. Considering only third order distortion and neglecting transmitter delay, the output of transmitter 11 at point C at the test frequency $\omega$ will be given by the equation:

$$V_o(\omega) = a[G + (\tfrac{3}{4})\alpha\{a^2 + 2\sum_n k^2 A_n^2\}]\sin\omega t + (\tfrac{3}{4})\beta a\{a^2 + 2\sum_n k^2 A_n^2\}\cos\omega t \quad (2)$$

where $G$ is the linear (amplitude) gain of the transmitter, $\alpha$ is the in-phase distortion coefficient, and
$\beta$ is the quadrature phase distortion coefficient.

The desired test frequency output is selected by passing the transmitter output through bandpass filter 19 which is centered at $\omega$. The output of this filter is now multiplied by two quadrature samples of the test-tone, $R \sin(\omega t + \phi)$ and $R \cos(\omega t + \phi)$.

More specifically, in synchronous detector 17, $V_o(\omega)$ is multiplied by $R \sin(\omega + \phi)$ producing a difference frequency output:

$$V_k = (\tfrac{1}{2}) Ra[G + (\tfrac{3}{4}) \alpha\{a^2 + 2\sum_n k^2 A_n^2\}] \cos\phi + \tfrac{3}{8} Ra\beta\{a^2 + 2\sum_n k^2 A_n^2\} \sin\phi. \quad (3)$$

As discussed above, the value of $k$ alternates between 1 and $k_1$ resulting in a corresponding modulation of $V_k$. The peak-to-peak amplitude of this rectangular modulation is:

$$V_1 - V_{k_1} = \tfrac{3}{4} R(1-k^2_1) a\sum_n A_n^2 (\alpha\cos\phi + \beta\sin\phi). \quad (4)$$

Use of a new variable $\theta = tg^{-1} \beta/\alpha$ will simplify equation (4) to:

$$V_1 - V_{k_1} = \tfrac{3}{4} R(1-k^2_1) a\sum_n A_n^2 \sqrt{\alpha^2 + \beta^2} \cos(\phi - \theta). \quad (5)$$

Similarly, we will find that detector 14, wherein $V_o(\omega)$ is multiplied by $R \cos(\phi t + \phi)$, will produce a modulated output signal given by the equation:

$$W_1 - W_{k_1} = (\tfrac{3}{4})R(1-k^2_1) a\sum_n A_n^2 \sqrt{\alpha^2 + \beta^2} \sin(\phi - \theta). \quad (6)$$

The difference frequency output from synchronous detectors 14 and 17 also includes the down-shifted noise passed by the test-tone filter 19. To reduce this noise, the detector outputs are passed through narrow band filters 21 and 23, each centered at the modulation frequency $\omega_m$.

The parameters $R$, $k_1$, $a$, $\alpha$, $\beta$, and $\theta$ in Equations (5) and (6) are constant. Since the output power, $P_o$ of transmitter 11 equals $G^2 \sum_n A_n^2$ and the third order IM coefficient $m_3$ is proportional to $(\alpha^2 + \beta^2/G^6)$, we can write:

$$V_1 - V_{k_1} \alpha P_o \sqrt{m_3} \cos(\phi - \theta) \quad (7)$$

$$W_1 - W_{k_1} \alpha P_o \sqrt{m_3} \sin(\phi - \theta). \quad (8)$$

By taking the sum of the squares of Equations (7) and (8), we could obtain $$(V_1 - V_{k_1})^2 + (W_1 - W_{k_1})^2 \alpha P_o^2 m_3 \quad (9)$$

and thereby eliminate the unknown phase angle $\phi$ of the reference signal, thus, making it possible to determine $P_o \sqrt{m_3}$. However, this squaring operation would reduce the already low signal-to-noise ratio at the output of the detectors, since it would rectify the background noise, which now would dominate in the squared output.

I have found that the sensitivity of our measurement technique is increased significantly if, instead of taking the sum of the squares of Equations (7) and (8), we take the larger of the two. This selection of the larger signal will not affect the signal-to-noise ratio. The uncertainty we introduce into the I.M. measurement by doing this is the ratio between the maximum value of either cos $(\phi - \theta)$ or sin $(\phi - \theta)$ and their crossover point; i.e., the ratio of 1 and $1/\sqrt{2}$. Thus, by taking the maximum M of Equations (7) and (8), we can determine $P_o \sqrt{m_3}$ between the limits:

$$M \leq P_o\sqrt{m_3} \leq M\sqrt{2}.$$

Thus, in the worst case $m_3$ will have a value 3 dB higher than the value indicated by the measurement.

When the message power, $P_o$, is known, M can be translated directly into values of the intermodulation coefficient $m_3$. When $P_o$ is not known, and can be expected to fluctuate with the message load, we can determine whether $m_3$ is larger or smaller than a critical value L by comparing M with a second signal $P_o\sqrt{L}$ in comparator 27. The signal $P_o\sqrt{L}$ can be obtained from square law detector 26 operating on the message spectrum, via coupler 24.

Because the processing of the test-tone from generator 12 between the output of transmitter 11 and input to comparator 22 is linear, the signal-to-noise ratio is not affected. The signal-to-noise ratio at the input to comparator 22 is determined as follows.

Assuming a 25 dB predistorter improvement applied to a TWT $M_{a-b+c} = -92$ dB; a message load of $+27$ dBm; and, a test-tone level of $+20$ dBm (both at the transmitter output), then the test-tone distortion, if taken alone, represents a signal level:

$$P_{dist.} = -92 - 25 + 20 + 27 + 27 = -43 \text{ dBm}.$$

If modulator 10 modulates the message level by 0.5 dB during the test, the resulting rectangular test-tone modulation has a peak-to-peak level which is 19 dB lower; and the first harmonic at the modulation frequency is 23 dB lower, or $-66$ dBm.

When the system noise is 41 dBrncO, the noise power in a 3 kHz slot is $-47.8$ dBmO. Since the TL at the transmitter output is $+5.6$ dB, the noise in a 3 kHz slot at that point is $-42.2$ dBm.

Assuming a message level modulation frequency of 50 Hz ($\omega_m$) and the use of modulation filters with a noise bandwith of 1 Hz, the noise level at the test-tone output becomes $-77$ dBm.

The signal-to-noise ratio available for the measurement is, therefor, $77 - 66 = 11$ dB, and the presence of the noise increases the signal level out of the modulation filter by 0.3 dB.

I stated above that the equivalent test signal level at the transmitter output is $-66$ dBm. To obtain this signal level using a conventional two-tone IM test would require test-tone levels $P_x$, where $$-92 - 25 - 6 + 3P_x = -66,$$

or $$P_x = (123-66/3) = 57/3 = +19 \text{ dBm}.$$

Thus, to obtain the same signal-to-noise ratio in a two-tone linearity test would call for tone levels of $+19$ dBm at the TWT output leading, as previously mentioned, to the distinct possibility of interference in adjacent FM systems.

Of course, the invention is not limited to use with single-sideband systems, but may be used with other forms of modulation. Nor, is the invention limited to microwave systems as it may also be used at lower frequencies with equal success. One skilled in the art may make various changes or substitutions to the layout of parts shown without departing from the spirit and scope of the invention.

What is claimed is:

1. A method of measuring the non-linearity of an active device subject to distortion, which comprises the steps of:
   generating a test-tone of constant amplitude and fixed frequency, said fixed frequency falling within the passband of the active device;
   adding said test-tone to an amplitude-modulated, multi-frequency signal which lies within the passband of said active device thereby forming a composite signal;
   applying said composite signal to the input of said active device; and then
   detecting, at the output of said active device, non-linear components of said test-tone signal, the amplitude of said non-linear components being directly proportional to the non-linearity of the device under test.

2. The method according to claim 1 wherein said detecting step comprises:
   filtering the output of said active device in a bandpass filter centered about the frequency of said test-tone;
   synchronously detecting the output of said bandpass filter with reference to in-phase and phase-quadrature versions of said test-tone signal;
   filtering said synchronously detected signals in bandpass filters which are centered about the frequency of the amplitude-modulation priorly imposed on said multi-frequency signal; and then
   selecting the larger of two filtered signals as the signal which is directly proportional to the non-linearity of the device under test.

3. The method according to claim 1 wherein said detecting step comprises:
   filtering the output of said active device in a bandpass filter centered about the frequency of said test-tone;
   synchronously detecting the output of said bandpass filter with reference to in-phase and phase-quadrature versions of said test-tone signal;
   filtering said synchronously detected signals in bandpass filters which are centered about the frequency of the amplitude-modulation priorly imposed on said multi-frequency signal;
   squaring each of the two filtered signals; and then
   summing the squared signals to produce a combined signal which is directly proportional to the non-linearity of the device under test.

4. Apparatus for measuring the non-linearity of an active device having a given passband comprising:
   means for amplitude modulating a multi-frequency input signal at an angular frequency $\omega_m$;
   a constant amplitude test tone generator of fixed angular frequency $\omega$, where $\omega >> \omega_m$ and falls within said passband;
   means for coupling the outputs from said modulating means and said generator to the input of said active device;
   and means, connected to the output of said active device for detecting the resultant non-linear components of the test-tone signal, the amplitude of said non-linear components being directly proportional to the non-linearity of the device under test.

5. The apparatus according to claim 4 wherein said detecting means comprises:
   a first bandpass filter having its passband centered about $\omega$, the angular frequency of said test-tone;

first and second synchronous detectors each having a first input connected to the output of said first bandpass filter and a second input connected to said test-tone generating means;

a phase-shifting network interposed between the output of said test-tone generating means and the second input of said first synchronous detector; and means for selecting the larger of the two outputs from said first and second synchronous detectors, said larger output being directly proportional to the non-linearity of said active device.

6. The apparatus according to claim 5 further including:

third and fourth bandpass filters respectively interposed between the outputs of said first and second synchronous detectors and the input to said output selecting means, each of said bandpass filters being centered about $\omega_m$, the angular frequency of said amplitude-modulating means.

7. The apparatus according to claim 5 further comprising:

means for tapping a portion of the output signal from said active device;

a square-law detector connected to the output of said tapping means; and a comparator having one input connected to the output of said square-law detector and another input connected to the output of said output selecting means, the output of said comparator comprising a signal which is proportional to the non-linearity of the active device.

* * * * *